United States Patent [19]

Fisher

[11] 4,387,367
[45] Jun. 7, 1983

[54] OPTICAL KEYBOARD

[76] Inventor: Charles R. Fisher, 34781 Glen Dr., Eastlake, Ohio 44094

[21] Appl. No.: 275,417

[22] Filed: Jun. 19, 1981

[51] Int. Cl.³ .......................... G08B 5/36; G06M 7/00; H01J 39/12
[52] U.S. Cl. ................................. 340/365 P; 178/18; 250/221
[58] Field of Search ................. 340/365 P; 178/17 D, 178/18; 250/221, 578, 553

[56] References Cited

U.S. PATENT DOCUMENTS

| | | | |
|---|---|---|---|
| 3,056,030 | 9/1962 | Kelchner | 340/365 P |
| 3,372,789 | 3/1968 | Thiele et al. | 340/365 P |
| 3,526,775 | 9/1970 | Friedrich et al. | 340/365 P |
| 3,757,322 | 9/1973 | Barkan et al. | 178/18 |
| 4,205,304 | 5/1980 | Moore | 340/365 P |

Primary Examiner—Thomas A. Robinson
Attorney, Agent, or Firm—Watts, Hoffmann, Fisher & Heinke Co.

[57] ABSTRACT

A matrixed, optical keyboard comprising structure 10 defining an array of touch areas 14 arranged in rows 16 and columns 17, and paired light sources and light sensors 20, 22 disposed at opposite ends of each row and each column and positioned to define a path of light. Light refocussing elements 24 are disposed contiguously about and define the touch areas and extend into the light path thereby refocussing the light beam prior to traversing each touch area and prior to impinging on the associated light sensor. In one embodiment, the keyboard and light refocussing elements are integrally molded and form a unitary structure. In another embodiment, the keyboard is formed with structure for maintaining an indicia card 44 behind and in alignment with the touch areas so that indicia area 44a are visible through the touch areas 14'.

7 Claims, 5 Drawing Figures

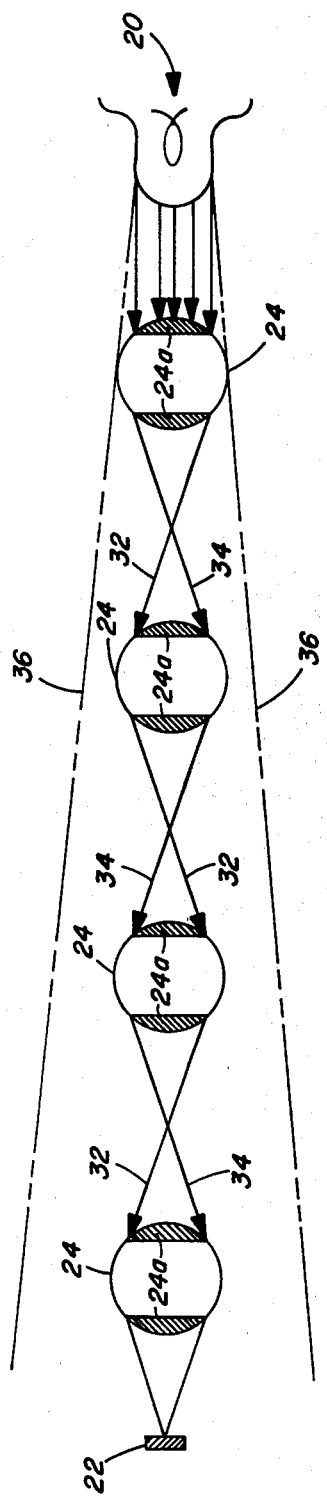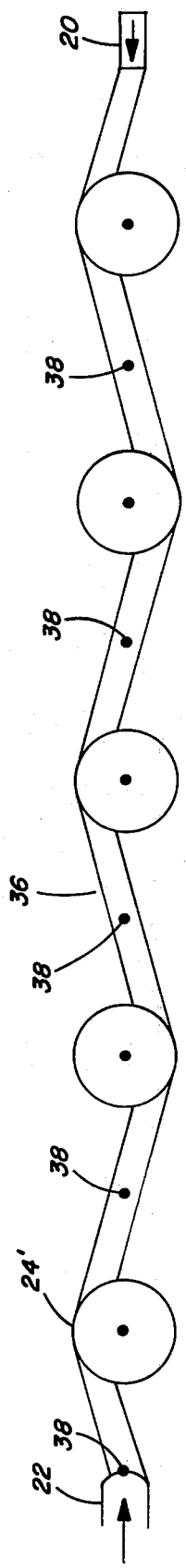
FIG. 3
FIG. 4

OPTICAL KEYBOARD

DESCRIPTION

1. Technical Field

The present invention relates generally to data entry devices and in particular to a matrixed, optical keyboard.

2. Background Art

Keyboards form the data input apparatus for a variety of devices. Many keyboards are mechanical in nature and include a plurality of mechanical switches actuated by depressing associated keys. As with all things mechanical, failures in the mechanical elements are often encountered especially when the keyboard is exposed to an adverse environment. Keyboards have been proposed which eliminate or minimize the "mechanical" elements in order to alleviate or reduce the reliability problems associated with mechanical keyboards.

Some of these proposed keyboards utilized controlled light paths to detect actuation or "touching" of specific key areas. For example, U.S. Pat. No. 3,056,030 discloses a typewriter having a light responsive photo-optical keyboard. A plurality of recesses, arranged in columns and rows forms a keyboard. A light source and associated photocell are disposed at opposite ends of the rows and columns that are located above the lower surface of the recess. Inserting a finger into the recess interrupts the light beam and suitable circuitry detects the key area being touched. It would appear from the construction disclosed, misalignment between the light source and the photocell as well as spurious ambient light may produce erroneous activation of the keyboard.

In U.S. Pat. No. 3,372,789 a different approach was suggested. Key areas molded into a panel each included an associated light detector including a focusing element. The keyboard was constructed of a light conducting material and a single light source disposed along an edge of the keyboard served as a light source for each key area. Insertion of a finger into the molded cavities of the keyboard interrupted the light path to the detector.

In still another proposed keyboard, disclosed in U.S. Pat. No. 4,205,304, the light emitters are sequentially energized to minimize detection of spurious light from adjacent light emitters. Although the keyboard disclosed may be less prone to spurious activation than other prior keyboards, the complexity and associated cost would render it unattractive in many applications.

In general, the need for an inexpensive optical keyboard, substantially immune to both spurious light as well as slight misalignments in the light source and light receptor has long been recognized but it is believed, has yet not been satisfied.

DISCLOSURE OF THE INVENTION

The present invention provides a new and improved optical keyboard that is substantially unaffected by ambient and spurious light that is both simple in construction and relatively inexpensive to manufacture.

According to a preferred embodiment, the invention comprises structure defining a plurality of keys in the form of "touch" areas arranged in at least one row, but preferably defining an array of touch areas arranged in rows and columns. A light source and associated light receptor are associated with each row and with each column, each pair defining a path of light extending across an associated row or column and above the surface of the touch areas. Light refocusing elements disposed between the touch areas and extending into the light path, include light refracting surfaces for refocusing the light beam traversing across the keys.

The disclosed construction reduces the light beam dispersion as it travels from the light source to the associated light receptor and obviates the need for critical alignment between the source and the receptor. Because the light beam is refocused prior to traversing each key and prior to impinging on the light receptor, light dispersion is minimized. Moreover, light beam misalignment with the light receptor is reduced because the refocusing elements partially correct for the misalignment and thus alignment errors do not accummulate as the beam traverses its predefined path. It has been found that even slightly misaligned light beams will pass through the focal points of each refocusing element. By locating the light receptor at the focal point of its associated light focusing element, the light receptor will always intercept the light beam even if slightly misaligned.

According to a feature of the invention, the light refocusing elements are located contiguous with and define the keys or touch areas. According to further aspects of this feature, the keyboard including the light refocusing elements are integrally molded and form a unitary structure. The disclosed keyboard construction is especially suited for adverse environments such as manufacturing areas where heat and contaminants such as dirt render prior keyboards unreliable.

According to another feature of the invention, the keyboard includes structure for maintaining an indicia card behind the touch areas. The card can be easily changed to modify the labeling of the keys. The disclosed keyboard provides an ideal data entry device for a job control terminal located in a manufacturing environment. Although the keyboard itself is exposed to the adverse environment, the absence of mechanical parts eliminates the sources of failure experienced with prior art keyboards. Moreover, the unitary nature of the keyboard prevents the entry of dirt and other contaminants into the data terminal and should reduce the incidence of maintenance to correct misalignment between the light source and the light receptor as well as service to clean switch contacts, etc., often necessary with prior keyboards.

Additional features and a full understanding of the invention will be obtained in reading the following detailed description made in connection with the accompanying drawings.

BRIEF DESCRIPTION OF THE DRAWINGS

FIG. 3 schematically illustrates a light beam path and refocusing elements forming part of the present invention;

FIG. 4 schematically illustrates the light beam path for a slightly misaligned light source; and, FIG. 5 is a perspective view of an alternate keyboard construction.

BEST MODE FOR CARRYING OUT THE INVENTION

Figure 1:
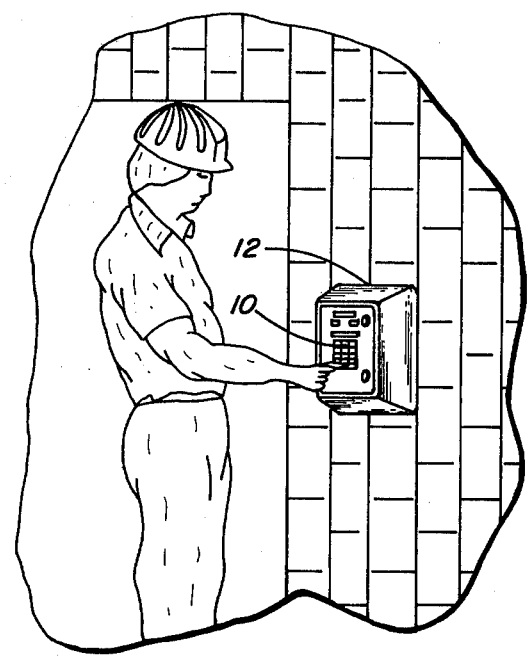
FIG. 1 is a perspective view of a job control terminal including a keyboard constructed in accordance with a preferred embodiment of the invention.
Figure 2:
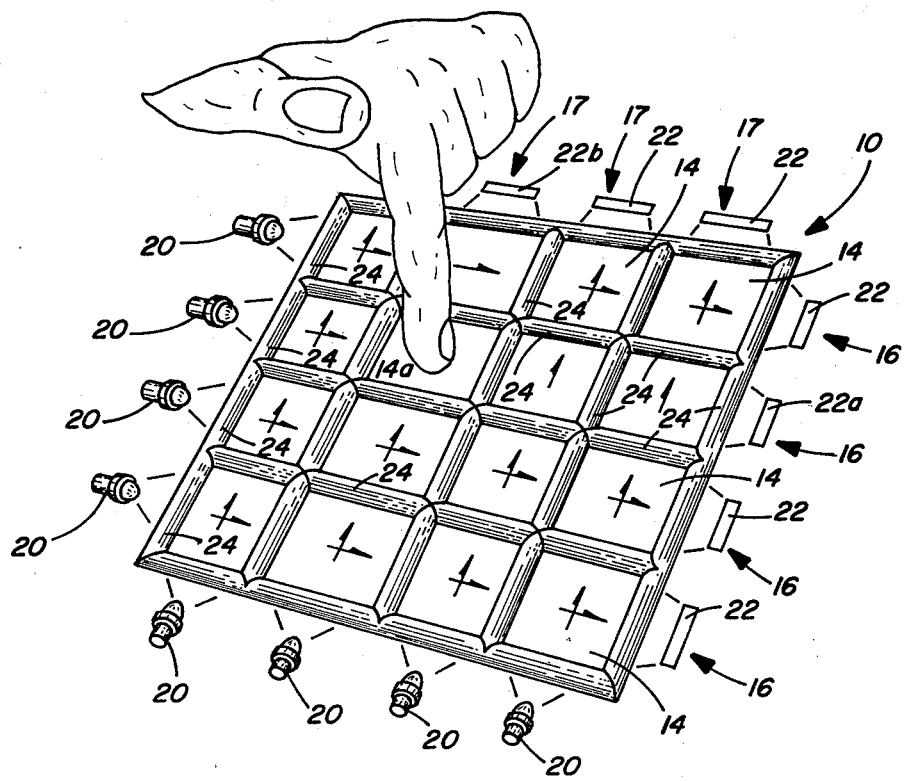
FIG. 2 is a perspective view of a keyboard constructed in accordance with a preferred embodiment of the invention.

FIG. 2 illustrates a keyboard 10 constructed in accordance with the preferred embodiment of the invention. In FIG. 1, the keyboard 10 is shown as part of a data entry device 12, namely a job control terminal. The terminal can act as a time clock as well as a means for controlling access to particular areas of a plant. The keyboard 10 serves as a means for entering data, i.e., access codes, special employee numbers, etc. As is well known, plant and work environments can adversely effect the operation and reliability of such terminals, the most troublesome component often being the keyboard itself.

The keyboard of the present invention however, unlike many prior art keyboards is relatively insensitive to humidity and temperature and therefore should be much more reliable than conventional mechanical keyboards. As seen best in FIG. 2, the keyboard comprises an array of keys in the form of touch areas 14 that in the preferred embodiment are arranged in a series of rows and columns, indicated generally by the reference character 16, 17, respectively. A light source 20 and a light receptor 22 are associated with each row and column 16, 17. The light source is positioned to emit a light beam above the level of the key areas 14 that form its associated row or column. In the preferred embodiment, each key area is defined by a planer surface and preferably each touch area 14 is located in the same plane.

According to the invention, light refocusing elements 24 refocus the light beam prior to traversing each key area 14. In particular, each refocusing element 24 comprises a rod-like member, four such members being positioned on the four contiguous sides of each touch area 14. In operation, the light beam leaving the light source 20 is refocused immediately, prior to traversing the first key area associated with that particular light source and is then refocused at each consecutive key area. The beam is also refocused after leaving the last key area of the associated row or column 16, 17 and prior to impinging on the associated light receptor 22.

This periodic refocusing minimizes light dispersion and it has been found that it also minimizes the criticality of the light source and light receptor alignment. FIG. 3 illustrates what is believed to be the principle of operation for the invention. Each refocusing element 24 defines opposed lens portions 24a. As the light beam passes through each element 24, the light refracting surfaces defined by the lens portions 24a focus or converge the light beam. As a result of the periodic refocusing, the light beam follows the light path indicated by the ray lines 32, 34 and thus dispersion of the beam is substantially reduced. The dashed ray lines 36 illustrate a light path for an unfocused light beam.

It has also been found that the present invention compensates for slight beam misalignments. It is believed that the refocusing elements 24 redirect a light beam in a direction opposite to the impingement angle. FIG. 4 illustrates an observed light path for a misaligned beam. As seen in this figure, the light beam leaves the source 20 at an upward angle and strikes the upper portion of the rightmost refocusing element 24. After passing through this element, the beam exits with a downward angle substantially equal, but opposite to the impingement angle. As a result, the beam then strikes the lower portion of the second refocusing element from which it exits at an equal, upward angle and so on. Consequently, the light beam envelope, indicated by the reference character 36 is confined and maintained between the upper and lower extremities of the refocusing elements 24 and thus remains within a predetermined distance of the keyboard area.

As observed and shown in both FIGS. 3 and 4, the light beam will always pass through a point, indicated by the reference character 38 located at the midpoint between adjacent refocusing elements 24. These points are believed to be the focal points for each refocusing element 24. This phenomenon is used to advantage by the present invention. As shown in both FIGS. 3 and 4, by locating the light receptor 22 at the focal point 38 of its associated refocusing element 24, alignment with the light beam is assured regardless of whether the beam is perfectly aligned or slightly misaligned. As seen in FIG. 4, even a misaligned beam will strike the receptor 22, if located at the focal point of the leftmost refocusing element 24'.

Although the keyboard 10 can be constructed from individual components, i.e., individual refocusing elements 24, and key areas 14 etc., in the preferred embodiment, the keyboard 10 is a unitary structure molded from a suitable transparent or semi-transparent plastic material. Using known injection molding techniques, the entire keyboard, including sockets for the light emitters and light receptors could be formed in one operation.

Figure 5:
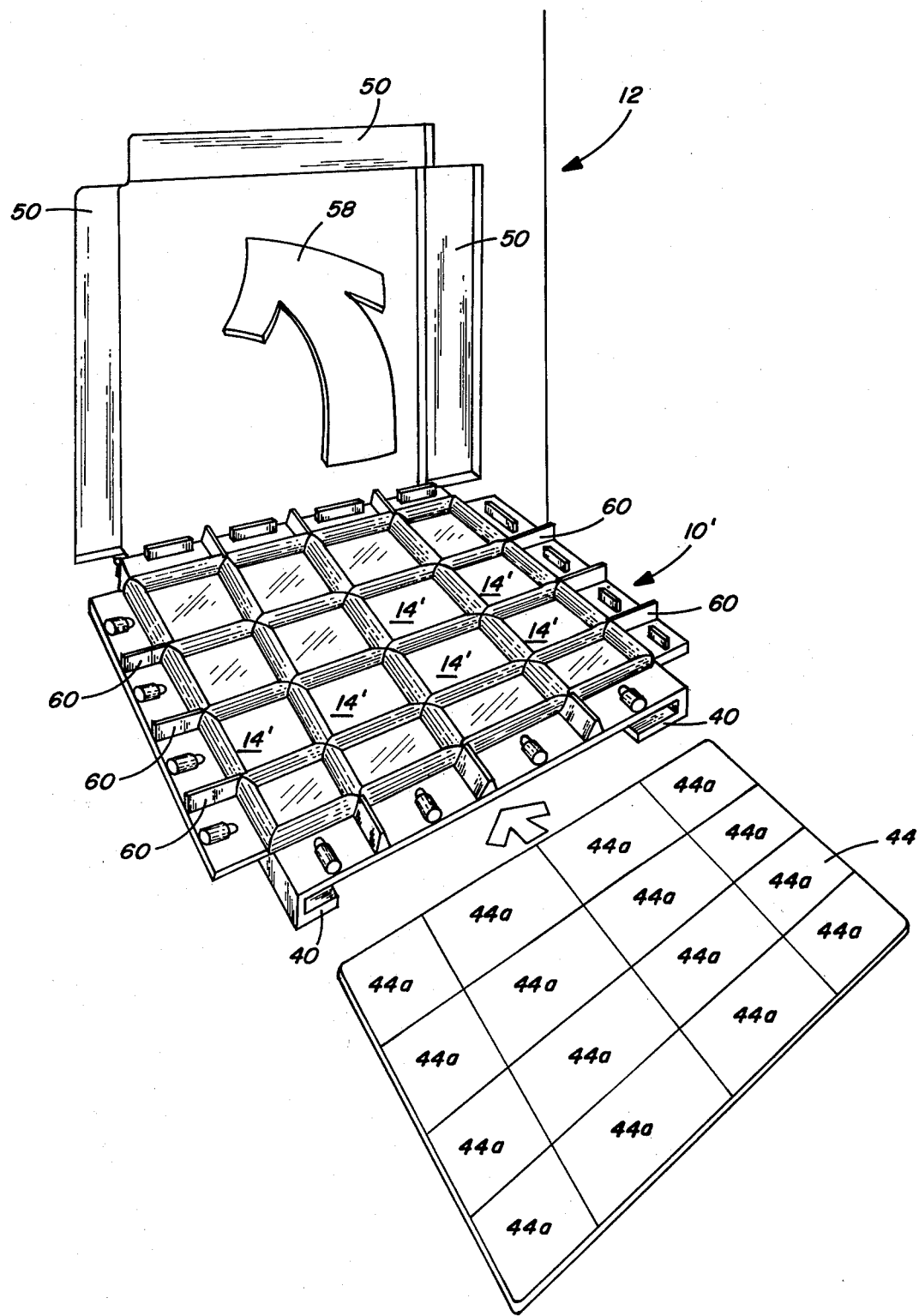

Referring to FIG. 5, an alternate keyboard 10' is shown. In this embodiment, the keyboard includes a pair of L-shaped brackets 40 formed on its underside that together define a trackway for receiving a removable indicia card 44. The card 44 includes a plurality of indicia bearing locations 44a that are aligned with the key areas 14' when the card 44 is inserted into the trackway. The key areas 14' of the keyboard 10' are transparent so that the indicia areas 44a are visible through the respective key areas. With this feature of the invention, the key area designations can be easily changed to accommodate various applications or a change in application, without requiring keyboard replacement.

In use, the keyboard 10' is adapted to fit within an opening defined by the terminal 12. In FIG. 5, the inside of the terminal cabinet is shown. Recesses 50 are formed on the inside surface of the front panel of the terminal along the sides of the keyboard opening. When the keyboard 10' is placed in the opening as indicated by the arrow 58, the marginal areas of the keyboard that mount the light sources 20 and light receptors 22 fit into the recesses and are protected thereby. When placed in the opening, only the touch areas 14' and associated refocusing elements 24 are visible. Once placed in the opening, the interior of the terminal 12 is sealed from the outside environment. The keyboard, by its unitary nature and absence of moving parts, prevents the entry of contaminants and dirt into the terminal. As seen in FIG. 5, shields 60 disposed between adjacent light sources 20 and light receptors 22 isolate these elements from each other and are molded into the keyboard.

Those in the art will recognize that the keyboard 10 is "matrixed" in order to provide 16 keys 14' with the use of eight pairs of light emitters and light receptors. As seen in FIG. 2, touching the key 14a (by a finger or other implement), will activate an associated row and column light receptor 22a, 22b respectively. Commercially available decoding circuitry (not shown) responds to the combination of receptor signals to generate a distinct signal corresponding to the particular key area 14a being activated.

Commercially available light sources that will function satisfactorily in the keyboard 10 include incandescent lamps, light emitting diodes (LED), infrared emitters, etc. Once the light source has been selected, a suitable light receptor sensitive to the type and quantity of light emitted by the light source is then selected. Once selected, the light sources and light receptors 20, 22 are connected to suitable circuitry which is readily available to those skilled in the art, to power the light sources and light receptors. Those skilled in the art will also recognize that commercially available decoding circuitry is connected to the light receptors 22 to receive and process the signals generated by them during operation.

Although the invention has been described with a certain degree of particularity, it is understood that various changes can be made to it by those skilled in the art without departing from the spirit or scope of the invention as described and hereinafter claimed.

I claim:

1. A matrix switch apparatus, comprising:
   (a) a panel defining an array of key areas arranged in rows and columns;
   (b) a paired light source and light receptor associated with each row, each pair determining a path of light extending across its associated row and above the surface of said panel, said light source and light receptor of each row pair disposed at opposite ends of their associated row and outside of said key areas defining said row;
   (c) a paired light source and light receptor associated with each column, each pair determining a path of light extending across its associated column and above the surface of said panel, said light source and light receptor of each column pair disposed at opposite ends of their associated column and outside of said key areas defining said column; and,
   (d) light refocusing elements disposed along the perimeter of each key area and in the path of the column and row light beams, each element including light refracting surfaces for refocusing said row and column light beams traversing the associated key area.

2. The apparatus of claim 1 wherein said light refocusing elements define the perimeter extent of said key areas.

3. The apparatus of claim 1 wherein said panel and refocusing elements are integrally molded and form a unitary structure.

4. The apparatus of claim 1 wherein said panel is formed from a transparent material and said apparatus further comprises means for maintaining an indicia carrying card along a rear surface of said panel, said indicia being aligned with said key areas.

5. A data entry device, comprising:
   (a) structure defining an array of touch areas arranged in columns and rows:
   (b) a light source and a light sensor disposed at opposite ends of each row and each column and positioned to define a path of light associated with each row and each column that traverses said associated row and column a predetermined distance above said touch areas;
   (c) light focusing elements forming part of rod-like members disposed contiguously about said touch areas and defining the perimeter thereof, said elements extending into the light path and operative to focus said light path at periodic intervals thereby reducing the light dispersion of the light beams traversing the rows and columns.

6. The apparatus of claim 5 wherein said touch areas are located in a common place.

7. The apparatus of claim 5 wherein said light focusing elements are integrally formed with said touch area structure.

* * * * *